(12) United States Patent
Liao

(10) Patent No.: US 11,367,591 B2
(45) Date of Patent: Jun. 21, 2022

(54) COMPOSITE PLASMA MODULATOR FOR PLASMA CHAMBER

(71) Applicant: TAIWAN SEMICONDUCTOR MANUFACTURING CO., LTD., Hsinchu (TW)

(72) Inventor: Han-Wen Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 504 days.

(21) Appl. No.: 15/419,257

(22) Filed: Jan. 30, 2017

(65) Prior Publication Data

US 2018/0158653 A1 Jun. 7, 2018

Related U.S. Application Data

(60) Provisional application No. 62/430,401, filed on Dec. 6, 2016.

(51) Int. Cl.
*C23C 16/00* (2006.01)
*H01L 21/306* (2006.01)
(Continued)

(52) U.S. Cl.
CPC ...... *H01J 37/32137* (2013.01); *H01J 37/321* (2013.01); *H01J 37/32091* (2013.01); *H01J 37/32119* (2013.01); *H01J 37/32467* (2013.01); *H01J 37/3411* (2013.01); *H01J 37/32348* (2013.01); *H01J 37/32458* (2013.01); *H01J 2237/332* (2013.01); *H01J 2237/334* (2013.01); *H01J 2237/335* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32238; H01J 37/32348; H01J 37/32458; H01J 37/32467; H01J 37/32486; H01J 37/32495; H01J 37/32504; H01J 37/32513; H01J 37/32559; H01J 37/32623; H01J 37/32633; H01J 37/32642; H01J 37/32651; H05H 1/2406; H05H 2001/2412; H05H 2001/463; H05H 2001/4652; H05H 2001/4667
See application file for complete search history.

(56) References Cited

U.S. PATENT DOCUMENTS 5,614,026 A * 3/1997 Williams ............ C23C 16/4412
118/723 ER
6,074,516 A * 6/2000 Howald ............ H01J 37/32477
156/345.24
(Continued)

*Primary Examiner* — Luz L Alejandro Mulero
(74) *Attorney, Agent, or Firm* — McClure, Qualey & Rodack, LLP

(57) ABSTRACT

A plasma-processing apparatus includes a chamber, a plasma generator, and a composite plasma modulator. The chamber includes a plasma zone. The plasma generator is configured to generate a plasma in the plasma zone. The composite plasma modulator is configured to modulate the plasma. The composite plasma modulator includes a dielectric plate made of a first dielectric material and a first modulating portion made of a second dielectric material and coupled to the dielectric plate.

20 Claims, 9 Drawing Sheets

(51) Int. Cl.
*H01J 37/32* (2006.01)
*H01J 37/34* (2006.01)

(56) References Cited

U.S. PATENT DOCUMENTS

| | | | | |
|---|---|---|---|---|
| 6,622,650 | B2* | 9/2003 | Ishii | H01J 37/32192 |
| | | | | 118/723 AN |
| 2004/0221815 | A1* | 11/2004 | Fukuda | H01J 37/321 |
| | | | | 118/723 I |
| 2004/0250955 | A1* | 12/2004 | Blonigan | H01J 37/32577 |
| | | | | 156/345.51 |
| 2004/0261718 | A1* | 12/2004 | Kim | H01J 37/321 |
| | | | | 118/723 AN |
| 2005/0028935 | A1* | 2/2005 | Wickramanayaka | ........... |
| | | | | H01J 37/3244 |
| | | | | 156/345.34 |
| 2011/0226421 | A1* | 9/2011 | Hayashi | H01J 37/3255 |
| | | | | 156/345.44 |
| 2014/0209027 | A1* | 7/2014 | Lubomirsky | H01J 37/3244 |
| | | | | 118/724 |

* cited by examiner

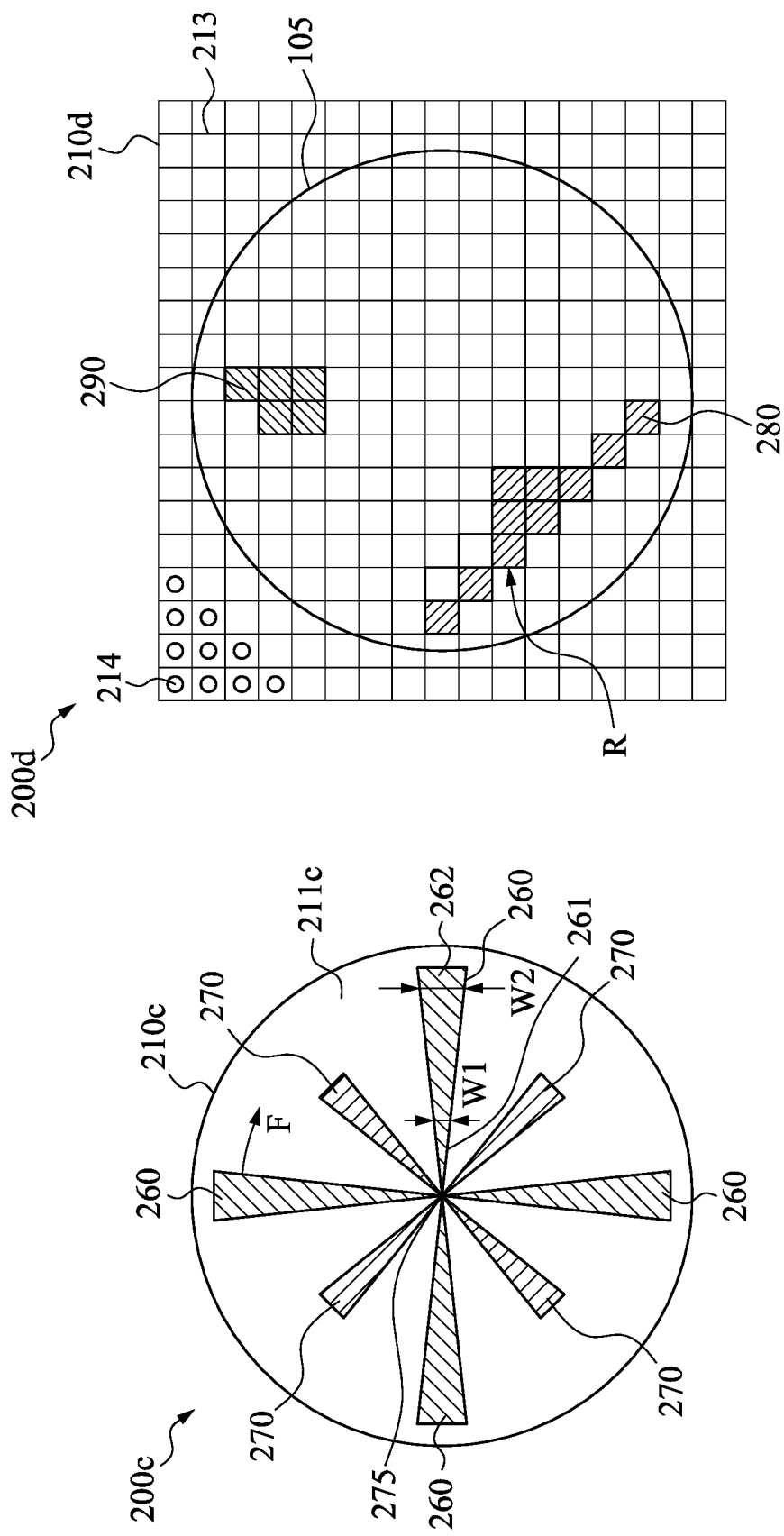

COMPOSITE PLASMA MODULATOR FOR PLASMA CHAMBER

CROSS REFERENCE TO RELATED APPLICATIONS

This application claims priority to Provisional Application Ser. No. 62/430,401, filed on Dec. 6, 2016, the entire disclosure of which is incorporated herein by reference.

BACKGROUND

The semiconductor integrated circuit (IC) industry has experienced rapid growth. Technological progress in IC manufacture has produced several generations of ICs, and each generation fabricates smaller and more complex circuits than the previous generation. Dry etching is an important method for fabrication of the semiconductor structures. Dry etching processes is used to remove material from the surface of the semiconductor wafer. Etch uniformity measures the quality of the etching process to evenly etch across the entire wafer. Maintaining uniformity across the entire wafer is important to achieve desired performance of the semiconductor integrated circuit. However, as structures of semiconductor devices become more complex and/or the size of the wafer become larger, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is plan view schematically illustrating a composite plasma modulator according to yet some embodiments of the present disclosure.

FIG. 11 is a plan view schematically illustrating a composite plasma modulator according to yet some embodiments of the present disclosure.

DETAILED DESCRIPTION

Figure 1:
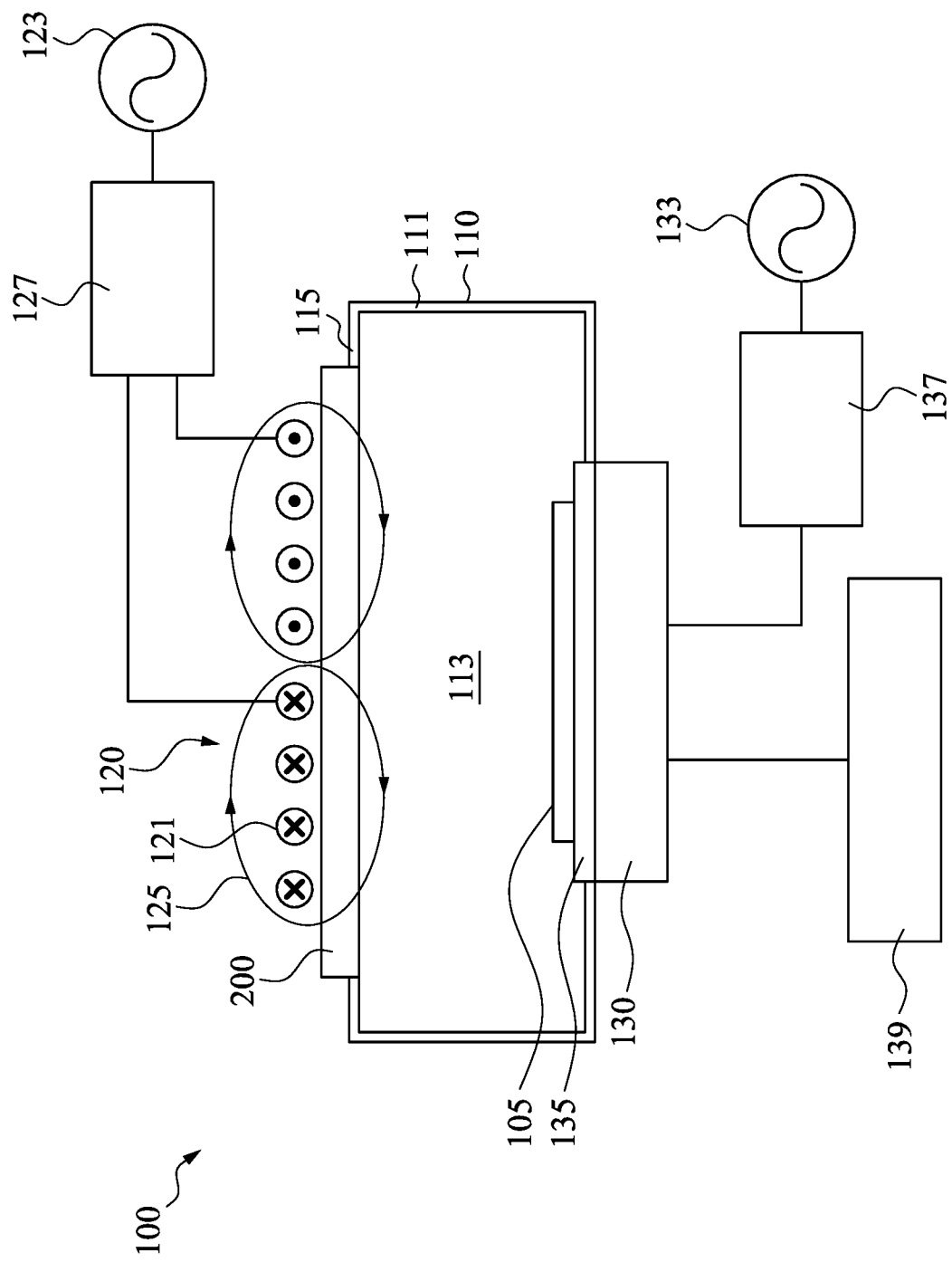
FIG. 1 is a drawing schematically illustrating a plasma-processing apparatus according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a composite plasma modulator for a plasma chamber and a plasma-processing apparatus having the composite plasma modulator. The plasma-processing apparatus may be any apparatus using plasma as working medium for manufacturing semiconductor devices. In some aspects of the present disclosure, the plasma-processing apparatus disclosed herein may improve the uniformity of processes by modulating the distribution of the plasma energy or plasma strength in the plasma chamber. In yet some aspects, however, the plasma-processing apparatus may provide an intended non-uniform distribution for intended purposes. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus 100 may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a drawing schematically illustrating a plasma-processing apparatus 100 according to various embodiments of the present disclosure. In some embodiments, the plasma-processing apparatus 100 may be a plasma etching apparatus such as for example a capacitively coupled plasma (CCP) etching apparatus, a reactive ion etching apparatus, or other etching apparatuses using plasma as etchant. In yet some embodiments, the plasma-processing apparatus 100 may be a deposition apparatus such as for example a sputtering apparatus, or other physical vapor deposition apparatuses. In addition, the plasma-processing apparatus 100 may be a cleaning apparatus, or other apparatuses using plasma as working medium.

As illustrated in FIG. 1, the plasma-processing apparatus 100 includes a chamber 110. The chamber 110 includes chamber wall 111 which encircles a plasma zone 113 therein. According to some embodiments of the present disclosure, the chamber 110 may be connected to a gas-supply source (not shown in FIG. 1), which is configured to supply a source gas into the chamber 110 for generating plasma. Illustrative examples of the gas include argon (Ar), helium (He), neon (Ne), oxygen ($O_2$), carbon tetrafluoride ($CF_4$), nitrogen trifluoride ($NF_3$), dichlorodifluoromethane ($CCl_2F_2$), borane chloride ($BCl_3$), carbon tetrachloride ($CCl_4$), silane ($SH_4$), and the like, and a combination thereof. In some embodiments, the chamber 110 may be connected to a pump (not shown in FIG. 1) for evacuating the process gas and controlling the pressure in the chamber 110.

A plasma generator 120 is included in the plasma-processing apparatus 100, and is configured to generate plasma in the plasma zone 113 of the chamber 110. In some embodiments, the plasma generator 120 include a spiral coil 121, which may be coupled to a RF power source 123. The spiral coil 121 may be energized by the RF power source 123 and therefore generates an electrical field 125. The electric field 125 causes dissociation of the gas in the chamber 110 so to form ions, radicals, and electrons. The generated electrons are accelerated by the electric field 125 and strike gas molecules that causes the gas molecules to be ionized. This process continues, and eventually plasma is generated and self-sustained in the plasma zone 113 of the chamber 110. In some embodiments, a matching network 127 is optionally provided between the spiral coil 121 and the RF power source 123 in order to match impedances and increase efficiency.

The plasma-processing apparatus 100 may optionally includes an electrode 130, over which a work piece 105 may be disposed. The electrode 130 is coupled to a RF power source 133, and may also be referred to as a bias electrode. The electrode 130 is configured to direct the ions in the plasma towards the work piece 105. When the plasma-processing apparatus 100 is an etching apparatus, the work piece 105 may include a semiconductor substrate such as for example a silicon wafer. Alternatively, when the plasma-processing apparatus 100 is a sputtering apparatus, the work piece 105 may be a sputtering target. In addition, a matching network 137 may be optionally provided between the electrode 130 and the RF power source 133 in order to match impedances and increase efficiency. A heating plate 135 may be optionally integrated to the electrode 130 for heating the work piece 105. Further, the heating plate 135 may be coupled to a temperature controller 139 for controlling the temperature of the heating plate 135.

Figure 2:
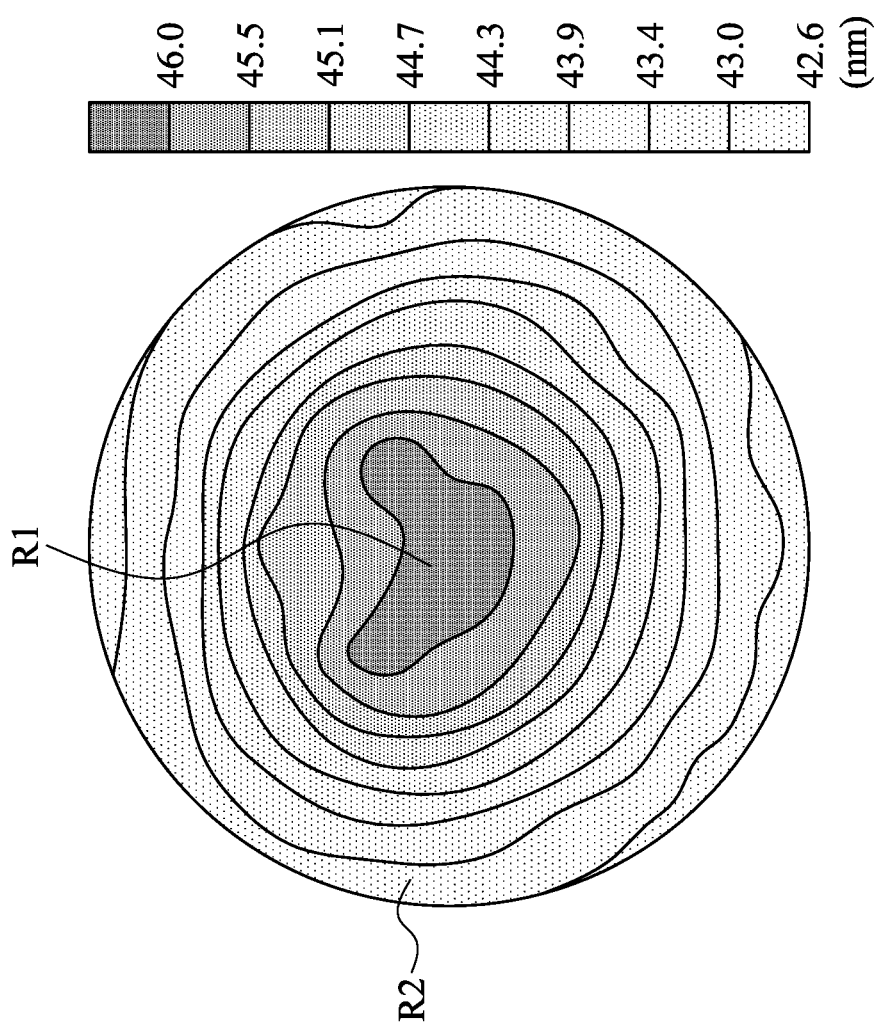
FIG. 2 is a figure schematically showing the non-uniformity associated with critical dimensions (CDs) of a wafer after an etching process according to some comparative examples of the present disclosure.

In some aspects of the present disclosure, it has been discovered that the uniformity of the plasma influences the uniformity of etching processes and/or deposition processes. Specifically, the distributions of the energy of plasma ions may dominate the uniformity of the etching rate and/or deposition. However, local effects of the apparatus 100, such as the geometry and size of the chamber 110 and the arrangement of the spiral coil 121, cause the non-uniformity in certain regions of the plasma zone 113. The non-uniform plasma causes several process issues, and decreases the manufacturing yield. FIG. 2 is a figure schematically showing the non-uniformity associated with critical dimensions (CDs) of a wafer after an etching process according to some comparative examples of the present disclosure. It can be observed in FIG. 2 that the CD values in the central region R1 are considerably greater than that in the region R2 around the perimeter of the wafer. Accordingly, in some aspects, the plasma-processing apparatus 100 disclosed herein may improve the uniformity of processes by modulating the distribution of the plasma energy. In yet some aspects of the present disclosure, however, the plasma-processing apparatus 100 may provide an intended non-uniform distribution of the plasma energy to compensate the non-uniformity of a certain layer formed in previous processes, and that is described in detail hereinafter.

Referring back to FIG. 1, the plasma-processing apparatus 10 further includes a composite plasma modulator 200, which is configured to modulate the plasma in the chamber 110. In some embodiments, the composite plasma modulator 200 may be disposed between the plasma generator 120 and the plasma zone 113 of the chamber 110. For example, the composite plasma modulator 200 may be coupled to or mounted on the chamber wall 115 of the chamber 110 adjacent to the plasma generator 120 (e.g., spiral coil 121). However, in yet some example, the composite plasma modulator 200 may be positioned in or out of the chamber 110 where it is able to modulate the plasma in the chamber 110. In yet some embodiments, the composite plasma modulator 200 is opposite to the electrode 130. The composite plasma modulator 200 includes a plurality of dielectric portions. The energy of the plasma ions can be influenced by the dielectric portions and therefore the distribution of energy of the plasma ions may be managed and/or modulated by the composite plasma modulator 200. Various embodiments of the composite plasma modulator 200 are discussed hereinafter with reference to FIGS. 3-11.

Figure 4:
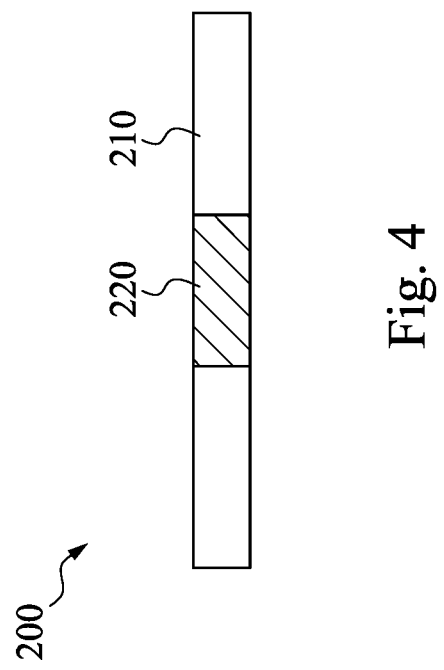
FIG. 4 is a cross-sectional view taken along line A-A' in FIG. 3.
Figure 3:
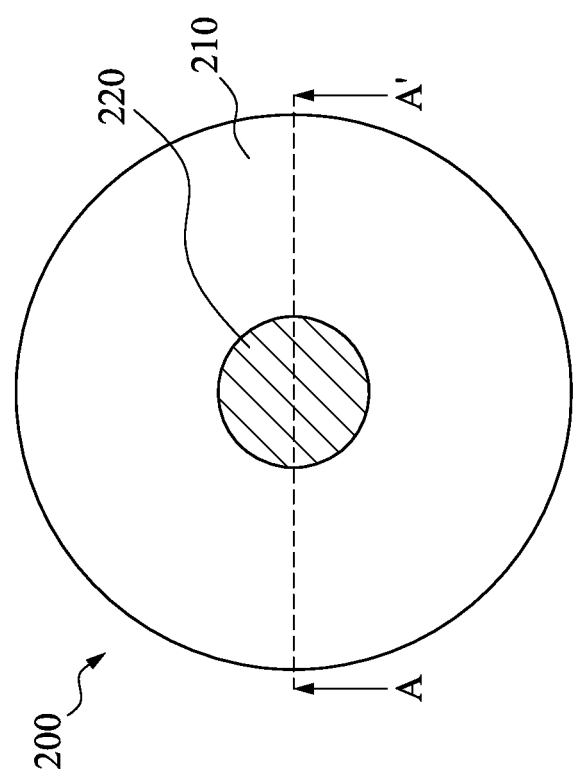
FIG. 3 is a plan view schematically illustrating a composite plasma modulator according to some embodiments of the present disclosure.

FIG. 3 is a plan view schematically illustrating the composite plasma modulator 200 according to some embodiments of the present disclosure. FIG. 4 is a cross-sectional view taken along line A-A' in FIG. 3. The composite plasma modulator 200 includes a substrate 210 and a modulating portion 220.

The substrate 210 includes a first dielectric material. Illustrative examples of the first dielectric material include quartz, ceramic materials, the like, and a combination thereof. Other examples of the first dielectric material include $SiO_2$, $Si_3N_4$, $Al_2O_3$, $Y_2O_3$, $TiO_2$, $HfO_2$, $ZrO_2$, Si, $Ta_2O_5$, $La_2O_3$, $SrTiO_3$, $ZrSiO_4$, $HfSiO_4$, the like, and a combination thereof. In some embodiments, the substrate 210 may have a circular contour. The substrate 210 may have other shapes or contours, rather than the illustrated circular shape, in accordance with yet some embodiments of the present disclosure. For example, the substrate 210 may be a dielectric plate, dielectric disk, or dielectric ring made of the first dielectric material.

The modulating portion 220 includes a second dielectric material, which is different from the first dielectric material of the substrate 210. The band gap of the second dielectric material of the modulating portion 220 is different from the band gap of the first dielectric material of the substrate 210.

In some embodiments, the second dielectric material of the modulating portion 220 has a band gap ranged from about 0.5 eV to about 10 eV. In some examples, the band gap of the second dielectric material may be ranged about 4 eV to about 10 eV, such as about 5 eV, about 6 eV, about 7 eV, about 8 eV and about 9 eV. In yet some examples, the band gap of the second dielectric material may be ranged about 0.5 eV to about 5 eV, such as about 0.8 eV, about 1 eV, about 2 eV, about 3 eV and about 4 eV. It is noted that the band gap of the second dielectric material of the modulating portion 220 may be greater or less than the band gap of the first dielectric material of the substrate 210. For example, when the band gap of the first dielectric material of the substrate 210 is ranged from 5 eV to 6 eV, the band gap of the second dielectric material may be in the range of 0.5-4.5 eV or in the range of 6.5-10 eV.

The dielectric material of the composite plasma modulator 200 affects the energy of the plasma ions in the chamber 110. In some embodiments, it has been observed that the energy of plasma ions in the plasma zone 113 decreases when the band gap of the dielectric material is increased. For example, when the band gap of the modulating portion 220 is greater than the band gap of the substrate 210, the energy of the plasma ions in the region corresponding to modulating portion 220 may be decreased. Therefore, the modulating portion 220 may compensate and/or modulate the non-uniformity of the energy of plasma ions caused by the geometry of the chamber 110 or the arrangement of the spiral coil 121. The composite plasma modulator 200 modulate the plasma by the arrangement of different dielectric materials, and the composite plasma modulator 200 is free of being connection to a voltage source in accordance with some embodiments.

In yet some embodiments, the second dielectric material of the modulating portion 220 has a dielectric constant ranged from about 1.5 to about 100. The dielectric constant of the second dielectric material of the modulating portion 220 may be greater or less than the band gap of the first dielectric material of the substrate 210. In some examples, the dielectric constant of the second dielectric material may be ranged from about 1.5 to about 16, such as about 2, about 2.5, about 3.0, about 4, about 9, and about 13. In yet some examples, the dielectric constant of the second dielectric material may be ranged about 15 to about 100, such as about 20, about 25, about 30, about 40, about 60, about 80, and about 90.

Illustrative examples of the second dielectric material of the modulating portion 220 include $SiO_2$, $Si_3N_4$, $Al_2O_3$, $Y_2O_3$, $TiO_2$, $HfO_2$, $ZrO_2$, Si, $Ta_2O_5$, $La_2O_3$, $SrTiO_3$, $ZrSiO_4$, $HfSiO_4$, the like, and a combination thereof. In some embodiments, the modulating portion 220 consists essentially of the second dielectric material.

The modulating portion 220 is coupled to the substrate 210. In some embodiments, the modulating portion 220 is embedded in the substrate 210, as shown in FIG. 4. In yet some embodiments, the modulating portion 220 may be disposed on a surface of the substrate 210. In particular, the modulating portion 220 may be disposed on and in direct contract with the surface of the substrate 210 facing the plasma zone 113 or the surface facing the plasma generator 120 (e.g., spiral coil 121).

In some embodiments, the modulating portion 220 is substantially located at a center of the composite plasma modulator 200 to compensate the non-uniformity of the plasma in the central region. As an example, referring to FIG. 2, when a relatively greater etching rate is presented at the central region, the modulating portion 220 may be arranged at the center of the composite plasma modulator 200. In this case, the modulating portion 220 has a band gap greater than that of the substrate 210. The etching rate in the central region may be reduced because the energy of the plasma ions in this region is reduced due to the modulating portion 220. Therefore, the non-uniform etching rate may be compensate and adjusted by the composite plasma modulator 200. In some examples, the modulating portion 220 may have a circular contour, as shown in FIG. 3.

Figure 5A:
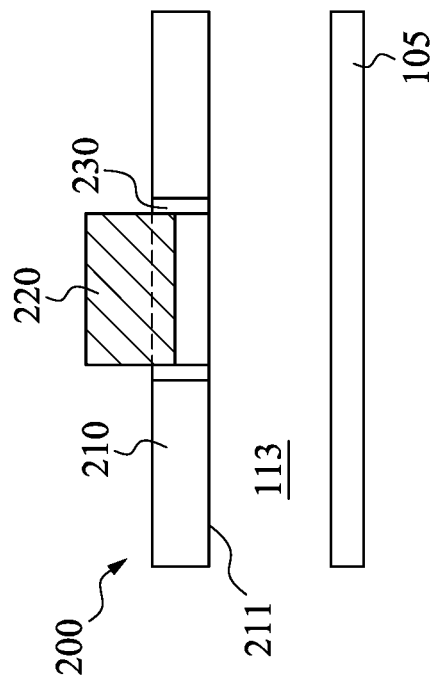
FIGS. 5A and 5B are cross-sectional views illustrating a composite plasma modulator according to some embodiments of the present disclosure.
Figure 5B:
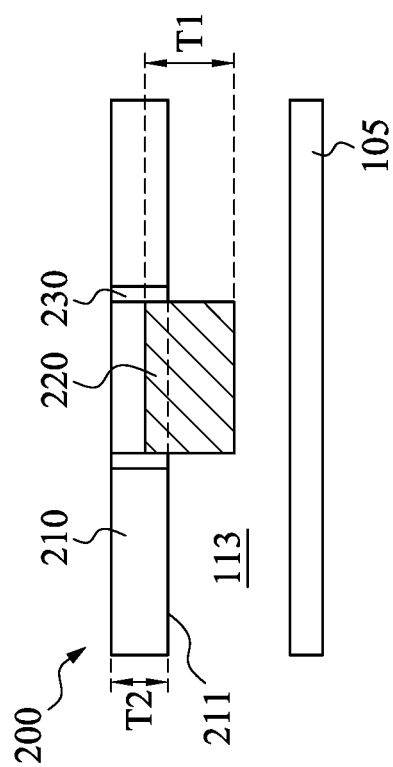

Referring to FIGS. 5A and 5B, the modulating portion 220 may be moveable relative to the substrate 210 of the composite plasma modulator 200 in accordance with some embodiments. The modulating portion 220, for example, is moveable along a direction perpendicular to a surface 211 of the substrate 210. As shown in FIG. 5A, the modulating portion 220 may be moved towards the work piece 105 (e.g., silicon wafer) while the substrate 210 of the composite plasma modulator 200 is fixed. Alternatively, as shown in FIG. 5B, the modulating portion 220 may be moved far away from the work piece 105 (e.g., silicon wafer). The adjustable displacement of the modulating portion 220 can increase or decrease the energy of the plasma ions in the local region corresponding to the modulating portion 220, depending upon the material of the modulating portion 220. In the embodiments where the band gap of the modulating portion 220 is greater than the substrate 210, the energy of the plasma ions in the corresponding region may be further decreased when the modulating portion 220 is moved towards the plasma zone 113. In some embodiments, the composite plasma modulator 200 may further include an adjustment mechanism 215 configured to adjust the displacement and/or position of the modulating portion 220 in the composite plasma modulator 200. In yet some embodiments, the thickness T1 of the modulating portion 220 is greater than the thickness T2 of the substrate 210. For example, the thickness T1 of the modulating portion 220 may be about 1 mm to about 30 mm.

Figure 7:
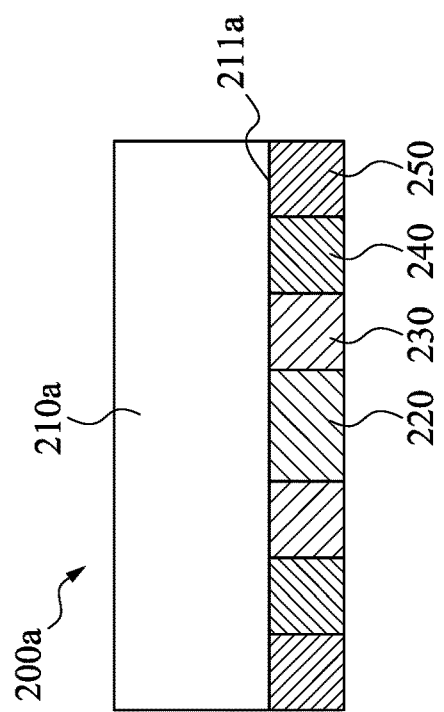
FIG. 7 is a cross-sectional view taken along line B-B' in FIG. 6.
Figure 6:
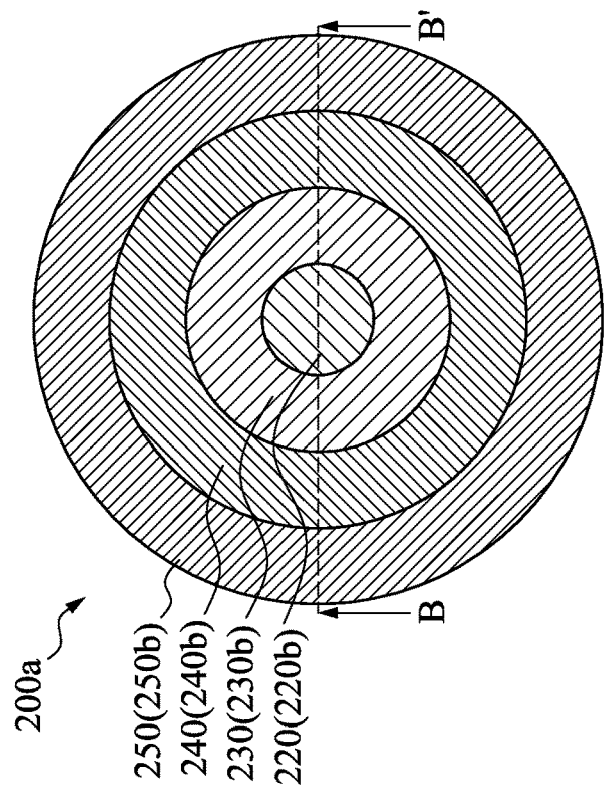
FIG. 6 is a plan view schematically illustrating a composite plasma modulator according to yet some embodiments of the present disclosure.

FIG. 6 is a plan view schematically illustrating a composite plasma modulator 200a according to yet some embodiments of the present disclosure. FIG. 7 is a cross-sectional view taken along line B-B' in FIG. 6. The composite plasma modulator 200 includes a dielectric plate 210a and a number of modulating portions, such as a first modulating portion 220, a second modulating portion 230, a third modulating portion 240, and a fourth modulating portion 250. The first, second, third, and fourth modulating portions 220, 230, 240, 250 are disposed on a surface 211a of the dielectric plate 210a. Particularly, the first modulating portion 220 is surrounded by the second modulating portion 230, which is surrounded by third modulating portion 240. Further, the fourth modulating portion 250 is arranged to encircle the first, second, and third modulating portions 220, 230, 240. In some embodiments, the first modulating portion 220 has a circular shape, whereas each of the second, third, and fourth modulating portions 230, 230, 240 has an annular contour.

In addition, the first, second, third, and fourth modulating portions 220, 230, 240, 250 respectively include a first, second, third, and fourth dielectric material, and each of the modulating portions 220, 230, 240, 250 has a dielectric constant and a band gap. The dielectric constant and/or band gap of one of the modulating portions 220, 230, 240, 250 is different form that of another one of the modulating portions 220, 230, 240, 250. In some embodiments, the dielectric constants and/or band gaps of the first, second, third, and fourth dielectric materials are different from each other. The arrangement of the dielectric constants and/or band gaps of these dielectric materials may be varied in a variety of manners for different purposes. For example, the arrangement of the modulating portions 220, 230, 240, 250 may be used to eliminate the non-uniformity of the plasma strength caused by local effect of the processing chamber.

In some embodiments, the band gaps of the first, second, third, and fourth dielectric materials are sequentially increased from the first modulating portion 220 to the fourth modulating portion 250. In yet some embodiments, the band gaps of the first, second, third, and fourth dielectric materials may be sequentially decreased from the first modulating portion 220 to the fourth modulating portion 250. In yet some embodiments, any one of the modulating portions 220, 230, 240, 250 may have the maximal or minimal dielectric constant (or band gap) among these modulating portions 220, 230, 240, 250.

In some embodiments, at least one of the modulating portions 220, 230, 240, 250 has a dielectric constant greater than the dielectric constant of the dielectric plate 210a, whereas another one of the modulating portions 220, 230, 240, 250 has a dielectric constant less than the dielectric constant of the dielectric plate 210a. In some embodiments, the dielectric constants and/or band gaps of all of the first, second, third, and fourth dielectric materials are different from that of dielectric plate 210a.

Further, not all of the modulating portions 220, 230, 240, 250 are needed, and any one of the modulating portions 220, 230, 240, 250 may be removed or omitted. For example, the central modulating portions 220 may be omitted, leaving the annular modulating portions 230, 240, 250. Alternatively, the modulating portions 230, 250 may be omitted, leaving the modulating portions 220, 240.

The band gaps of the modulating portions 220, 230, 240, 250 are in the range from about 0.5 eV to about 10 eV, in accordance with some embodiments. In some examples, the band gap of the modulating portions 220, 230, 240, 250 may be ranged about 4 eV to about 10 eV, such as about 5 eV, about 6 eV, about 7 eV, about 8 eV and about 9 eV. In yet some examples, band gaps of the modulating portions 220, 230, 240, 250 may be about 0.5 eV to about 5 eV, such as about 0.8 eV, about 1 eV, about 2 eV, about 3 eV and about 4 eV.

The dielectric constant of the modulating portions 220, 230, 240, 250 are in the range from about 1.5 to about 100, in accordance with some embodiments. In some examples, the dielectric constant of the second dielectric material may be about 1.5 to about 16, such as about 2, about 2.5, about 3.0, about 4, about 9, and about 13. In yet some examples, the dielectric constant of the second dielectric material may be ranged about 15 to about 100, such as about 20, about 25, about 30, about 40, about 60, about 80, and about 90.

Figure 9:
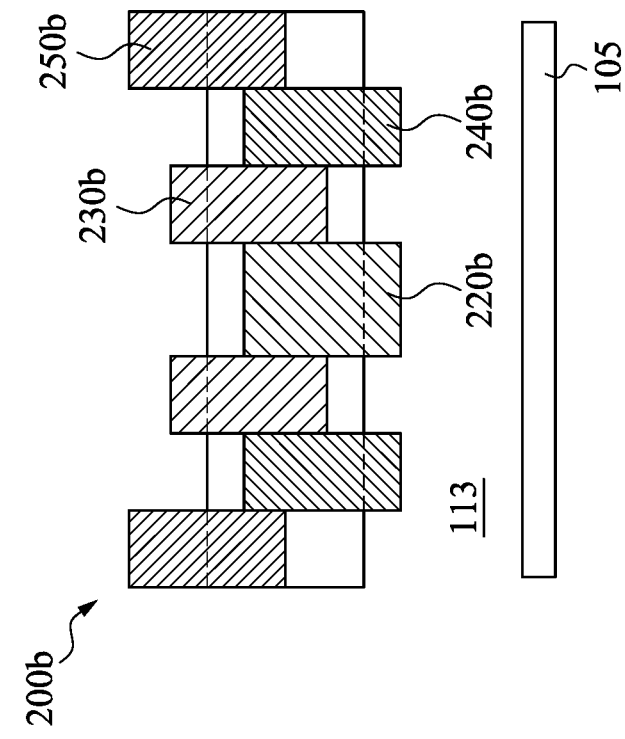
FIGS. 8 and 9 are a cross-sectional view schematically illustrating a composite plasma modulator according to yet some embodiments of the present disclosure.
Figure 8:
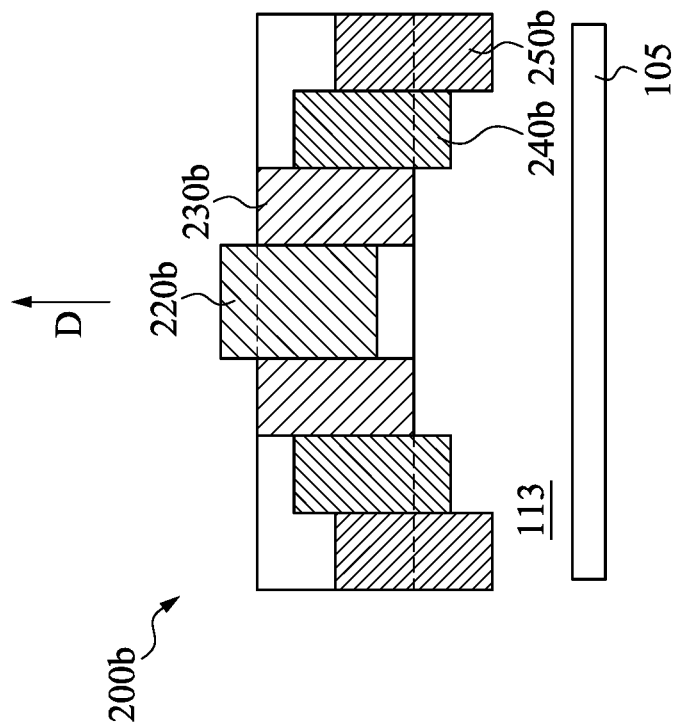

FIG. 8 is a cross-sectional view schematically illustrating a composite plasma modulator 200b according to yet some embodiments of the present disclosure. The plane view of the composite plasma modulator 200b may be the same as that depicted in FIG. 6. The composite plasma modulator 200b includes a number of modulating portions 220b, 230b, 240b, 250b. The modulating portions 220b, 230b, 240b, 250b are moveable relative to each other. Two adjacent ones of the modulating portions 220b, 230b, 240b, 250b are engaged with each other. In examples, the modulating portions 220b, 230b, 240b, 250b respectively include a first, a second, a third, and a fourth dielectric material, and each of the modulating portions 220b, 230b, 240b, 250b has a dielectric constant and a band gap. The dielectric constant and/or band gap of one of the modulating portions 220b, 230b, 240b, 250b is different form that of another one of the modulating portions 220b, 230b, 240b, 250b. In some embodiments, the dielectric constants and/or band gaps of the modulating portions 220b, 230b, 240b, 250b are different from each other. The modulating portions 220b, 230b, 240b, 250b are moveable towards or far away from the plasma zone 113, and the energy of plasma ions may be modulated by the displacement of the modulating portions 220b, 230b, 240b, 250b. The adjustable displacement of the modulating portions 220b, 230b, 240b, 250b can independently fine tune the energy of the plasma ions in the respective regions corresponding to the modulating portions 220b, 230b, 240b, 250b. Therefore, the composite plasma modulator 200b having the moveable modulating portions 220b, 230b, 240b, 250b may be adapted to different processes. For example, as shown in FIG. 8, the modulating portions 220b, 230b, 240b, 250b may be adjusted in an axis direction D such that the composite plasma modulator 200b has a step-liked bottom surface. The modulating portion 220b at the center of the composite plasma modulator 200b is moved to a position that is farthest away from the work piece 105, whereas the modulating portion 250b at the periphery of the composite plasma modulator 200b is moved to a position that is nearest to the work piece 105. The configuration shown in FIG. 8, for example, may be adapted to a process chamber with a sequentially-changed concentric non-uniformity. Alternatively, as illustrated in FIG. 9, the modulating portions 220b, 230b, 240b, 250b may be move to another configuration for adapting to another process chamber with an intermittent annular non-uniformity.

FIG. 10 is plan view schematically illustrating a composite plasma modulator 200c according to yet some embodiments of the present disclosure. The composite plasma modulator 200c includes a dielectric disk 210c and a plurality of first modulating blades 260 coupled to the dielectric disk 210c. The first modulating blades 260, for example, may be disposed on the surface 211c of the dielectric disk 210c which adjacent to the plasma zone of the chamber. The first modulating blades 260 are configured to modulate the energy of the plasma ions in the chamber. Each of the first modulating blades 260 includes a dielectric material different from a dielectric material of the dielectric disk 210c. Therefore, each of the first modulating blades 260 has a dielectric constant (and/or band gap) different from that of the dielectric disk 210c. As shown in FIG. 9, each of the first modulating blades 260 may extend from a center of the dielectric disk 210c to a position within (or alternatively out of) the dielectric disk 210c, along a radial direction of the dielectric disk 210c. In some embodiments, each modulating blade 260 has an end 261 adjacent to the center of the dielectric disk 210c and an opposite end 262 adjacent to the periphery of the dielectric disk 210c. The width W1 of the end 261 is less than the width W2 of the opposite end 262. In some embodiments, each modulating blade 260 has a sector or triangular shape, and the length of each first modulating blade 260 is substantially equal to the radius of the dielectric disk 210c.

In yet some embodiments, the composite plasma modulator 200c further includes a plurality of second modulating blades 270. Each of the second modulating blades 270 includes a dielectric material different from the dielectric material of the first modulating blades 260. Therefore, each of the first modulating blades 260 has a dielectric constant (and/or band gap) different from that of the first modulating blades 260. Further, each of the second modulating blades 270 may extend from the center of the dielectric disk 210c to a position within the dielectric disk 210c, along the radial direction of the dielectric disk 210c. The length of each second modulating blade 270 may be less than the length of each first modulating blade 260. In some examples, each second modulating blade 260 has a sector or triangular shape.

The first modulating blades 260 and the second modulating blades 270 are extended on an identical level, in accordance with some embodiments. For example, the first and second modulating blades 260, 270 may extend on the same surface 211c of the dielectric disk 210c. In some examples, each second modulating blade 270 are arranged between two adjacent first modulating blades 260. The thickness of each second modulating blade 270 may be greater or less than the thickness of each first modulating blade 260.

The first and second modulating blades 260, 270 are rotatable with respect to the dielectric disk 210c, in accordance with some embodiments. In particular, each of the first and the second modulating blades 260, 270 may be rotated in a clockwise direction (or counter clockwise direction), as illustrated by arrow F in FIG. 9. In examples, a joint structure 275 may be provided to joint first and the second modulating blades 260, 270 with the dielectric disk 210c. For instance, the joint structure 275 may be a pivot at the center of the dielectric disk 210c such that the first and second modulating blades 260, 270 are pivotally connected to the dielectric disk 210c.

FIG. 11 is a plan view schematically illustrating a composite plasma modulator 200d according to yet some embodiments of the present disclosure. The composite plasma modulator 200d includes a dielectric plate 210d and one or more quadrangular modulating portions 280. The quadrangular modulating portions 280 include a dielectric material different from the dielectric material of the dielectric plate 210d. The dielectric constant (or band gap) of the quadrangular modulating portions 280 may be greater or less than the dielectric constant (or band gap) of the dielectric plate 210d. Therefore, the energy of plasma ions mat be locally modulated by the quadrangular modulating portions 280. The quadrangular modulating portions 280 are detachably fixed or mounted on the dielectric plate 210d. In some embodiments, the dielectric plate 210d includes a plurality of holding structures such as for example clamping structures 213 and/or catches 214 for detachably fixing the quadrangular modulating portions 280 onto the dielectric plate 210d.

The quantity and the arrangement of the quadrangular modulating portions 280 can be varied to fit for different characteristics of various processing chambers. As illustrated in FIG. 11, the composite plasma modulator 200d may be aligned with the work piece 105 in some embodiments. Each of quadrangular modulating portions 280 may be sized to fit for one of the fields or dies of the work piece 105. Therefore, the plasma strength corresponding to each field or die of the work piece 105 may be individually managed and modulated by the arrangements of the quadrangular modulating portions 280. For example, while non-uniformity is present at region R of the work piece 105, the quadrangular modulating portions 280 may be disposed at the corresponding area of the composite plasma modulator 200d, and thereby the non-uniformity may be suppressed or improved. Further, different processing chamber probably have different non-uniformity patterns, and the composite plasma modulator 200d disclosed herein can be adapted to various processing chambers.

In yet some embodiments, the composite plasma modulator 200d further includes a plurality of quadrangular modulating portions 290, which include a dielectric material different from the dielectric materials of the dielectric plate 210d and the quadrangular modulating portions 280. In some examples, the dielectric constant of each quadrangular modulating portion 290 is greater than the dielectric constant of the dielectric plate 210d, whereas the dielectric constant of each quadrangular modulating portions 280 is less than the dielectric constant of the dielectric plate 210d. In yet some examples, the dielectric constant of the quadrangular modulating portions 290 is ranged between the dielectric constant of the dielectric plate 210d and the dielectric constant of the quadrangular modulating portions 280.

Figure 12:
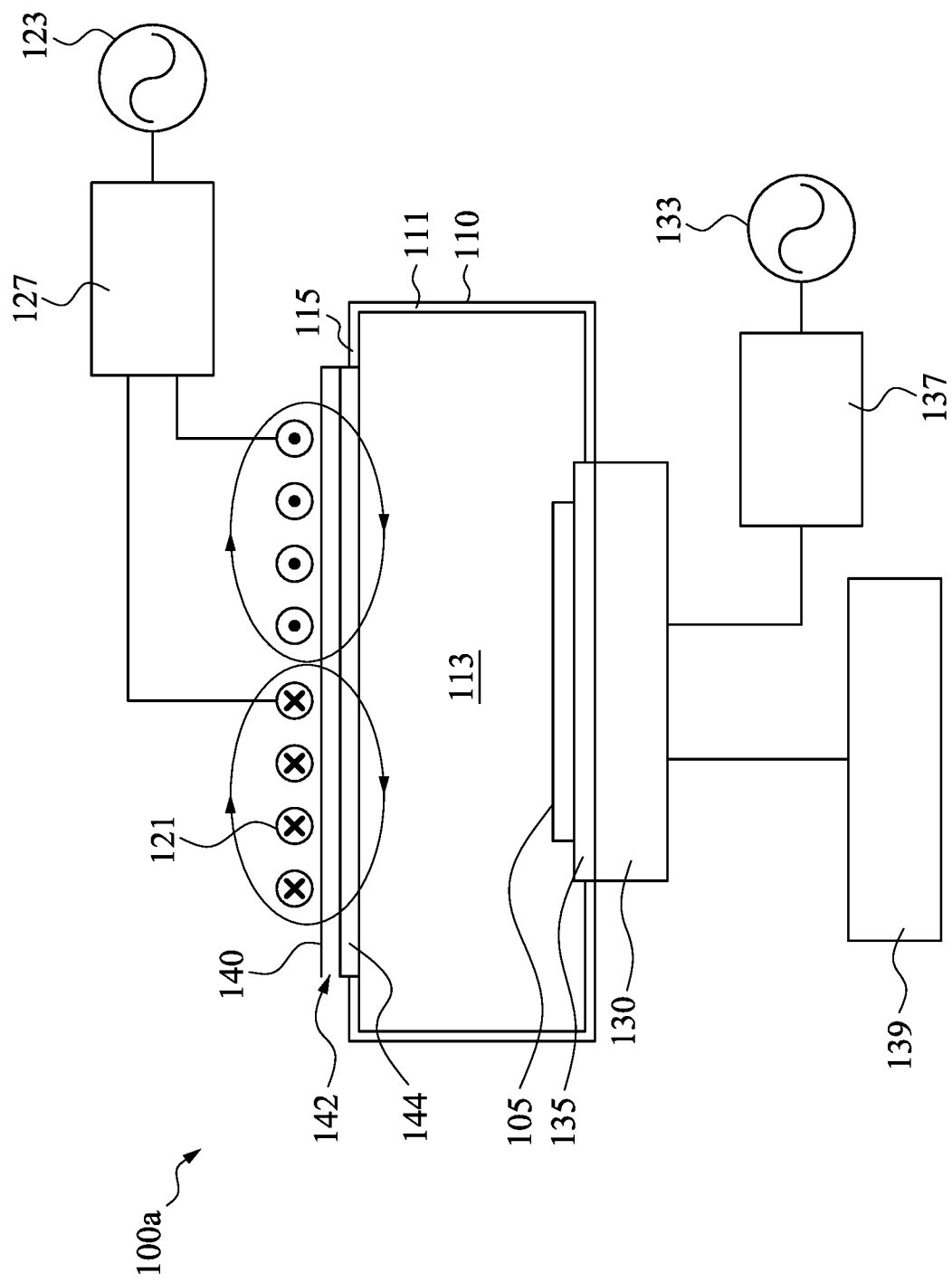
FIG. 12 is a drawing schematically illustrating a plasma-processing apparatus according to yet some embodiments of the present disclosure.

FIG. 12 illustrates a plasma-processing apparatus 100a in accordance with yet some embodiments of the present disclosure. The plasma-processing apparatus 100a is similar in structure to the plasma-processing apparatus 100 shown in FIG. 1, except that the plasma-processing apparatus 100a further includes a slot shell 140. The slot shell 140 is adjacent to a chamber wall 115, and a slot 142 is present in the slot shell 140. The slot 142 is configured to accommodate the composite plasma modulator disclosed in the present disclosure, such as for example composite plasma modulators 200, 200a, 200b, 200c, 200d. In some embodiments, the slot shell 140 may has a bottom plate 144 fastened to the chamber wall 115, and the slot 142 is located over the bottom plate 144. The composite plasma modulator may be inserted into the slot 142, or be taken out from the slot 142. While the plasma-processing apparatus 100a exhibits different non-uniformity patterns in different processes, a suitable composite plasma modulator may be used and inserted into the slot 142 to rectify the non-uniformity.

Figure 13A:
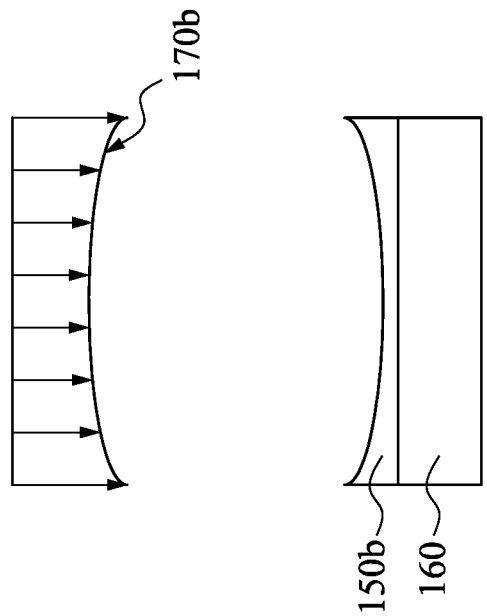
FIGS. 13A and 13B are drawings schematically illustrating application of intended non-uniform plasma strength in semiconductor manufacturing.
Figure 13B:
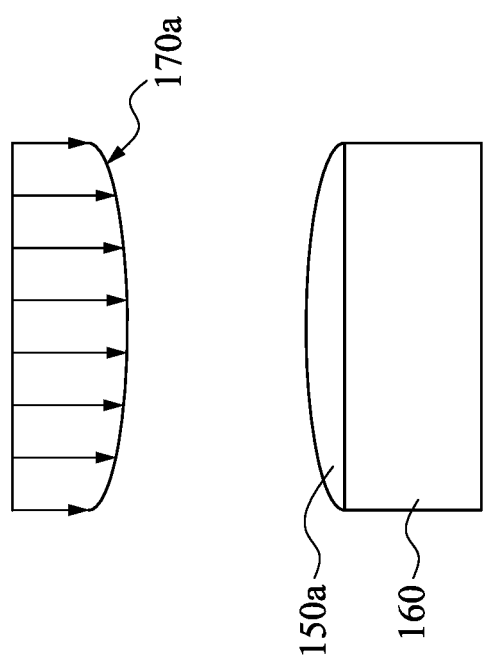

Although a number of embodiments described hereinbefore are described in a manner of improving the uniformity of plasma strength, the plasma-processing apparatus and composite plasma modulator disclosed herein may be used to provide an intended non-uniform plasma strength. FIGS. 13A and 13B are drawings schematically illustrating application of intended non-uniform plasma strength in semiconductor manufacturing processes. As a layer formed on a wafer has a non-uniform thickness, an etching process with complementary distribution of etching rate may be provided to rectify the non-uniformity of thickness by using the composite plasma modulator disclosed herein. For example, as illustrated in FIG. 13A, when the layer 150a has a maximal thickness at the central region of the wafer 160, the distribution of etching rate 170a may be modulated to have a maximal etching rate at the central region. Therefore, the non-uniformity of thickness may be rectified. On the other hand, as illustrated in FIG. 13B, when the layer 150b has a minimal thickness at the central region of the wafer 160, the distribution of etching rate 170b may be modulated to have a minimal etching rate at the central region. Accordingly, the non-uniformity of the layer(s) or structure(s) formed in previous processes may be rectified in the subsequent processes. The composite plasma modulator and the apparatus disclosed herein may provide a desired distribution of plasma strength in various plasma-processing chambers such as for example etching chambers and deposition chambers.

In accordance with one aspect of some embodiments, a composite plasma modulator for a plasma chamber is provided. The composite plasma modulator includes a substrate and a first modulating portion. The substrate includes a first dielectric material. The first modulating portion includes a second dielectric material and is coupled to the substrate. The first dielectric material is different from the second dielectric material.

In accordance with another aspect of some embodiments, a plasma-processing apparatus includes a chamber, a plasma generator, and a composite plasma modulator. The chamber includes a plasma zone. The plasma generator is configured to generate a plasma in the plasma zone. The composite plasma modulator is configured to modulate the plasma. The composite plasma modulator includes a dielectric plate made of a first dielectric material and a first modulating portion made of a second dielectric material and coupled to the dielectric plate.

In accordance with another aspect of some embodiments, a plasma-processing apparatus includes a chamber, a plasma generator, a composite plasma modulator, and an electrode. The chamber includes a plasma zone. The plasma generator is configured to generate a plasma in the plasma zone. The composite plasma modulator is disposed between the plasma generator and the plasma zone. The composite plasma modulator includes a first dielectric portion made of a first dielectric material and a second dielectric portion made of a second dielectric material. The second dielectric portion is coupled to the first dielectric portion. The electrode is opposite to the composite plasma modulator.

What is claimed is:

1. A composite plasma modulator for a plasma chamber, the composite plasma modulator comprising:
   a dielectric cylinder made of a first dielectric material and having a vertical axis; and
   a first dielectric annulus made of a second dielectric material different from the first dielectric material, wherein the first dielectric annulus encircles the dielectric cylinder in a concentric manner in a plan view, the dielectric cylinder is linearly movable along a vertical direction parallel with the vertical axis, the first dielectric annulus is also linearly movable along the vertical direction parallel with the vertical axis of the dielectric cylinder, and a range of motion of the dielectric cylinder along the vertical direction is independent of a range of motion of the first dielectric annulus along the vertical direction, and when the dielectric cylinder and the first dielectric annulus are in motion, an inner sidewall of the first dielectric annulus always contacts an outer sidewall of the dielectric cylinder.

2. The composite plasma modulator according to claim 1, wherein a bottom surface of the dielectric cylinder forms a step-liked surface with a bottom surface and the inner sidewall of the first dielectric annulus.

3. The composite plasma modulator according to claim 1, further comprising a second dielectric annulus encircling the first dielectric annulus and made of a third dielectric material different from the second dielectric material of the first dielectric annulus.

4. The composite plasma modulator according to claim 1, further comprising a second dielectric annulus encircling the first dielectric annulus, wherein a bottom surface of the second dielectric annulus is lower than a bottom surface of the first dielectric annulus.

5. The composite plasma modulator according to claim 1, wherein the first dielectric material of the dielectric cylinder comprises $SiO_2$, $Si_3N_4$, $Al_2O_3$, $Y_2O_3$, $TiO_2$, $HfO_2$, $ZrO_2$, Si, $Ta_2O_5$, $La_2O_3$, $SrTiO_3$, $ZrSiO_4$, $HfSiO_4$, or a combination thereof.

6. The composite plasma modulator according to claim 1, further comprising a second dielectric annulus encircling the first dielectric annulus, wherein the second dielectric annulus is also linearly movable along the vertical direction parallel with the vertical axis of the dielectric cylinder, and a range of motion of the second dielectric annulus along the vertical direction is independent of the range of motion of the dielectric cylinder along the vertical direction and the range of motion of the first dielectric annulus along the vertical direction.

7. A plasma-processing apparatus, comprising:
   a chamber comprising a plasma zone;
   a plasma generator comprising a spiral coil configured to generate a plasma in the plasma zone;
   a composite plasma modulator between the spiral coil and the chamber, wherein the composite plasma modulator comprises:
      a dielectric cylinder made of a first dielectric material and having a vertical axis;
      a first dielectric annulus encircling the dielectric cylinder and made of a second dielectric material different from the first dielectric material, wherein when the dielectric cylinder and the first dielectric annulus are in motion, an inner sidewall of the first dielectric annulus always contacts an outer sidewall of the dielectric cylinder; and
      a second dielectric annulus encircling the first dielectric annulus, and made of a third dielectric material different from the second dielectric material, wherein the first dielectric annulus is linearly movable along a vertical direction parallel with the vertical axis of the dielectric cylinder, the second dielectric annulus is also linearly movable along the vertical direction parallel with the vertical axis of the dielectric cylinder, and a range of motion of the first dielectric annulus along the vertical direction is independent of a range of motion of the second dielectric annulus along the vertical direction.

8. The plasma-processing apparatus according to claim 7, further comprising a slot shell adjacent to a chamber wall of the chamber, wherein a slot is present in the slot shell, and the slot is configured to accommodate the composite plasma modulator.

9. The plasma-processing apparatus according to claim 7, wherein the third dielectric material of the second dielectric annulus has a dielectric constant ranged from about 1.5 to about 100.

10. The plasma-processing apparatus according to claim 7, wherein the dielectric cylinder is also linearly movable along the vertical direction parallel with the vertical axis, and a range of motion of the dielectric cylinder along the vertical direction is independent of the range of motion of the first dielectric annulus along the vertical direction and the range of motion of the second dielectric annulus along the vertical direction.

11. The plasma-processing apparatus according to claim 7, further comprising a third dielectric annulus encircling the second dielectric annulus, wherein the third dielectric annulus is also linearly movable along the vertical direction parallel with the vertical axis of the dielectric cylinder, and a range of motion of the third dielectric annulus along the vertical direction is independent of the range of motion of the second dielectric cylinder along the vertical direction.

12. The plasma-processing apparatus according to claim 7, wherein lowermost positions of the dielectric cylinder and the first and second dielectric annuluses are exposed to the plasma zone of the chamber.

13. A plasma-processing apparatus, comprising:
   a chamber comprising a plasma zone;
   a plasma generator comprising a spiral coil configured to generate a plasma in the plasma zone in the chamber;
   a composite plasma modulator between the spiral coil and the plasma zone, wherein the composite plasma modulator comprises:

a dielectric cylinder made of a first dielectric material and having a vertical axis;

a first dielectric annulus encircling the dielectric cylinder and made of a second dielectric material different from the first dielectric material, wherein when the dielectric cylinder and the first dielectric annulus are in motion, an inner sidewall of the first dielectric annulus always contacts an outer sidewall of the dielectric cylinder; and a second dielectric annulus encircling the first dielectric annulus, and made of a third dielectric material different from the second dielectric material, wherein the dielectric cylinder is movable along a vertical direction parallel with the vertical axis, the second dielectric annulus is also linearly movable along the vertical direction parallel with the vertical axis of the dielectric cylinder, and a range of motion of the dielectric cylinder along the vertical direction is independent of a range of motion of the second dielectric annulus along the vertical direction; and an electrode opposite to the composite plasma modulator.

14. The composite plasma modulator according to claim 1, wherein the first dielectric material of the dielectric cylinder has a band gap greater than the second dielectric material of the first dielectric annulus.

15. The composite plasma modulator according to claim 1, wherein a bottom surface of the first dielectric annulus is lower than a bottom surface of the dielectric cylinder.

16. The plasma-processing apparatus of claim 13, wherein the second dielectric annulus has an inner sidewall extending straight upwardly from and substantially in a direction normal to a bottommost surface thereof to the topmost surface thereof.

17. The plasma-processing apparatus of claim 13, wherein the first dielectric annulus is also linearly movable along the vertical direction parallel with the vertical axis of the dielectric cylinder, and a range of motion of the first dielectric annulus along the vertical direction is independent of the range of motion of the dielectric cylinder along the vertical direction and the range of motion of the second dielectric annulus along the vertical direction.

18. The plasma-processing apparatus of claim 13, further comprising a third dielectric annulus encircling the second dielectric annulus and made of a fourth dielectric material different from the third dielectric material of the second dielectric annulus.

19. The plasma-processing apparatus of claim 18, wherein the third dielectric annulus is also linearly movable along the vertical direction parallel with the vertical axis of the dielectric cylinder, and a range of motion of the third dielectric annulus along the vertical direction is independent of the range of motion of the first dielectric cylinder along the vertical direction.

20. The plasma-processing apparatus of claim 13, wherein lowermost positions of the dielectric cylinder and the first and second dielectric annuluses are exposed to the plasma zone of the chamber.

* * * * *